United States Patent
Sumino et al.

(10) Patent No.: US 9,130,341 B2
(45) Date of Patent: Sep. 8, 2015

(54) SEMICONDUCTOR LASER DRIVE APPARATUS AND IMAGE FORMING APPARATUS

(71) Applicants: Daijiro Sumino, Osaka (JP); Takao Watanabe, Kanagawa (JP)

(72) Inventors: Daijiro Sumino, Osaka (JP); Takao Watanabe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/273,839

(22) Filed: May 9, 2014

(65) Prior Publication Data
US 2014/0341243 A1    Nov. 20, 2014

(30) Foreign Application Priority Data
May 15, 2013 (JP) ................................. 2013-102677

(51) Int. Cl.
H01S 5/0683 (2006.01)
H01S 5/042 (2006.01)
H01S 5/40 (2006.01)

(52) U.S. Cl.
CPC .............. *H01S 5/0683* (2013.01); *H01S 5/042* (2013.01); *H01S 5/4025* (2013.01)

(58) Field of Classification Search
CPC ......... H01S 5/02; H01S 5/0683; H01S 5/042; H01S 5/4025; H01S 4/042
USPC ....................................................... 372/38.02
See application file for complete search history.

(56) References Cited

U.S. PATENT DOCUMENTS

2006/0088070 A1*  4/2006  Kyougoku et al. ......... 372/38.02
2012/0027037 A1   2/2012  Sumino et al.

FOREIGN PATENT DOCUMENTS

JP    2004-153118    5/2004

* cited by examiner

*Primary Examiner* — Xinning Niu
(74) *Attorney, Agent, or Firm* — Cooper & Dunham LLP

(57) ABSTRACT

A semiconductor laser drive apparatus includes: a current setting circuit that stores a first set value for a light-emission current obtained by subtracting a first bias current used when the semiconductor laser element emits light, from a drive current used when the semiconductor laser element emits light, a second set value for the first bias current, and a third set value for a second bias current used when the semiconductor laser element does not emit light; a first current generator circuit that generates a first input current from the first set value; a second current generator circuit that generates a second input current from the second set value and a third input current from the third set value; and a switching circuit that supplies a sum of the first and second input currents to a drive circuit when a light-emission control signal is on, and the third input current to the drive circuit when the light-emission control signal is off.

11 Claims, 8 Drawing Sheets

SEMICONDUCTOR LASER DRIVE APPARATUS AND IMAGE FORMING APPARATUS

CROSS-REFERENCE TO RELATED APPLICATIONS

This patent application is based on and claims priority pursuant to 35 U.S.C. §119 to Japanese Patent Application No. 2013-102677, filed on May 15, 2013, in the Japan Patent Office, the entire disclosure of which is hereby incorporated by reference herein.

BACKGROUND

1. Technical Field

The present invention relates to a semiconductor laser drive apparatus and an image forming apparatus using the semiconductor laser drive apparatus.

2. Background Art

A semiconductor laser drive apparatus used in a high-speed, high-definition laser printer, digital copier, and the like, needs to drive a semiconductor laser element with a desired light-emission delay and light-emission pulse width. Hence, a technique is known in which a threshold current at which the semiconductor laser element emits light is detected in advance, and the threshold current is caused to flow through the semiconductor laser element as a bias current immediately before the semiconductor laser element emits light, to activate the semiconductor laser element. By this, light-emission delay is reduced, enabling to obtain an excellent light-emission pulse width at turn-on.

In addition, the semiconductor laser drive apparatus has a shading correction function. The term "shading" as used herein refers to variations in density caused by nonuniformity of the amount of light of a laser beam which scans an exposed surface (image surface). To eliminate shading, the semiconductor laser element emits light such that the amount of light is uniform over the exposed surface (shading correction).

A conventional semiconductor laser drive apparatus merely detects only one threshold current from a slope of the amount of light emission with respect to a drive current for when a semiconductor laser element is turned on at a desired amount of light emission. More specifically, when the amount of light emission is represented as a function of the drive current, a threshold current is determined from an intersection of a tangent line at the desired amount of light emission and a straight line of an amount of light emission of 0 mW. Therefore, when the slope of the amount of light emission with respect to the drive current is small, a threshold current to be detected also tends to be small. In the case of using a semiconductor laser element where the linearity of the amount of light emission with respect to the drive current is lost, such as that the slope of the amount of light emission with respect to the drive current gets smaller as the drive current gets larger, a detected threshold current is smaller than the actual threshold current of the semiconductor laser element. In this case, there is a problem that an excellent light-emission delay and light-emission pulse width cannot be obtained.

SUMMARY

According to an embodiment of the present invention, there is provided a semiconductor laser drive apparatus including: a semiconductor laser element supplied with a drive current, the drive current being controlled according to a light-emission control signal indicating on or off; a drive circuit that generates a drive current corresponding to an input current and supplies the drive current to the semiconductor laser element; a current setting circuit that stores a first set value for a light-emission current obtained by subtracting a first bias current used when the semiconductor laser element emits light, from a drive current used when the semiconductor laser element emits light of a desired amount of light emission, a second set value for the first bias current, and a third set value for a second bias current used when the semiconductor laser element does not emit light; a first current generator circuit that generates a first input current from the first set value; a second current generator circuit that generates a second input current from the second set value and generates a third input current from the third set value; and a switching circuit that supplies a sum of the first and second input currents to the drive circuit when the light-emission control signal is on, and supplies the third input current to the drive circuit when the light-emission control signal is off.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
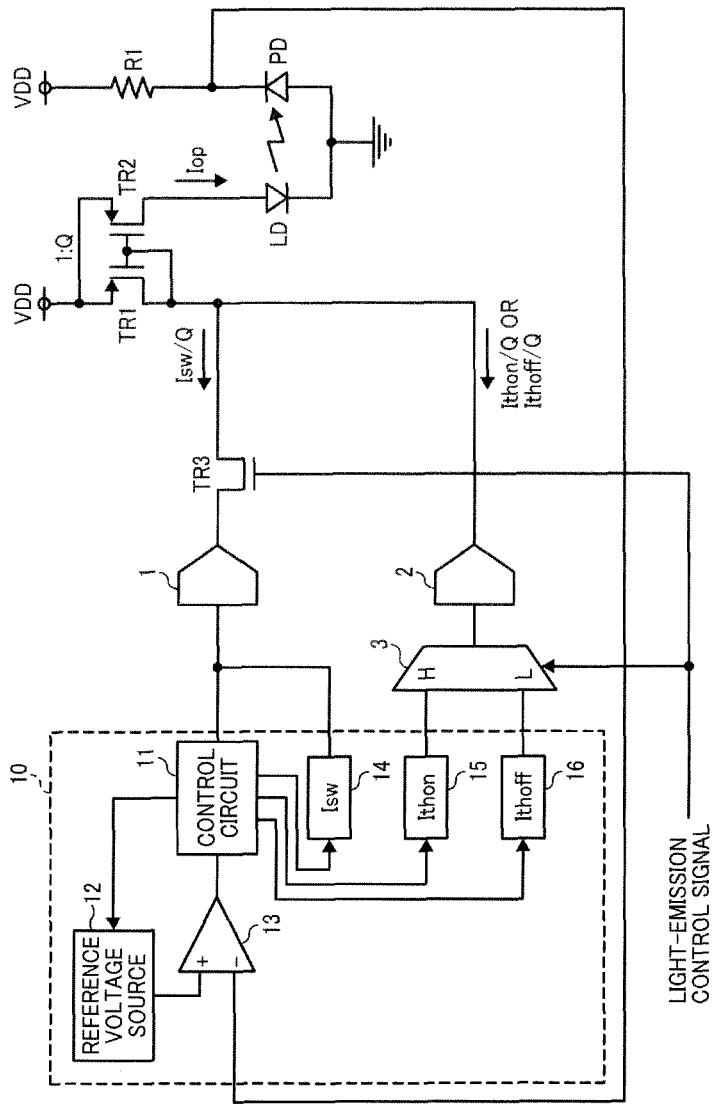
FIG. 1 is a block diagram illustrating a configuration of a semiconductor laser drive apparatus according to an embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF THE INVENTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

An embodiment of the present invention will be described below with reference to the drawings. In the drawings, the same reference signs indicate like components.

Before describing a semiconductor laser drive apparatus according to an embodiment of the present invention, a semiconductor laser drive apparatus according to a comparative example will be described with reference to FIGS. 5 to 8.

Figure 5:
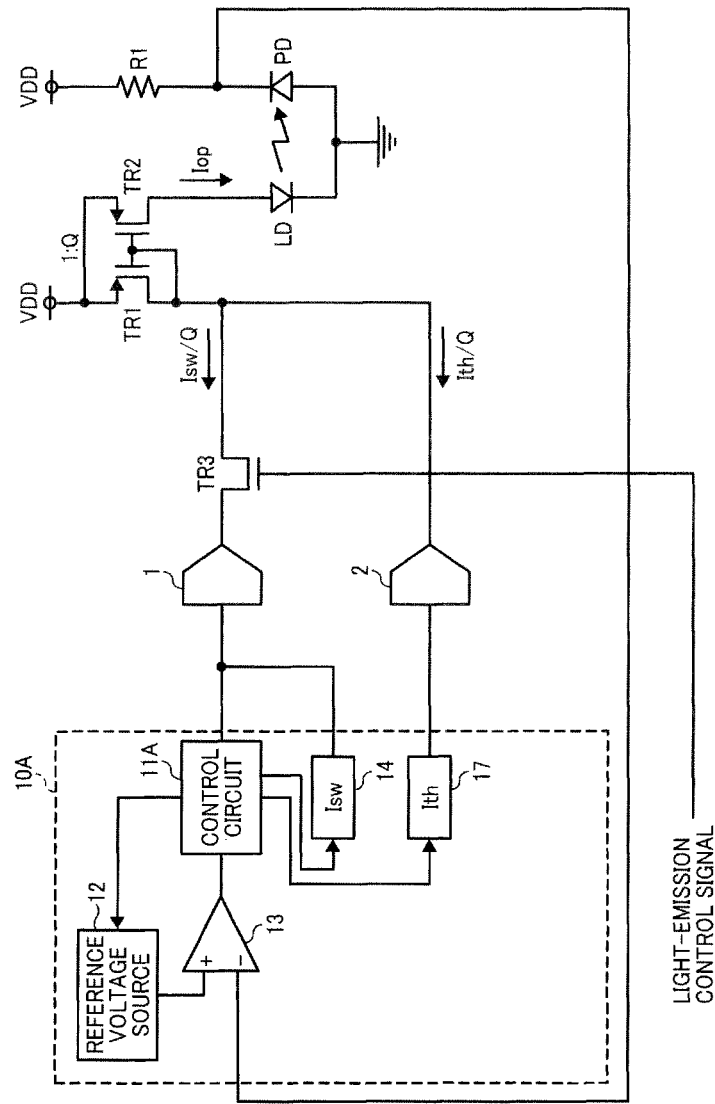
FIG. 5 is a block diagram illustrating a configuration of a semiconductor laser drive apparatus according to a comparative example.

FIG. 5 is a block diagram illustrating a configuration of a semiconductor laser drive apparatus according to a comparative example. The semiconductor laser drive apparatus of FIG. 5 includes a current setting circuit 10A, current generator circuits 1 and 2, a switch TR3, transistors TR1 and TR2, a laser diode LD, a photodiode PD, and a resistor R1. The current setting circuit 10A includes a control circuit 11A, a reference voltage source 12, a comparator 13, and registers 14 and 17. The semiconductor laser drive apparatus of FIG. 5 controls a drive current Iop to be supplied to the laser diode LD, according to a light-emission control signal instructing to turn on or off the laser diode LD.

The transistors TR1 and TR2 are current mirror circuits that generate a drive current Iop having a magnitude (e.g., a factor of Q) corresponding to the magnitude of an input current, and supply the drive current Iop to the laser diode LD. The transistors TR1 and TR2 operate as drive circuits for the laser diode LD. The photodiode PD generates a voltage signal indicating the amount of light emission of the laser diode LD.

The control circuit 11A of the current setting circuit 10A performs a set current determination process which will be described later with reference to FIG. 6, to compute a light-emission current Isw and a threshold current Ith of the laser diode LD, and store set values for the light-emission current Isw and the threshold current Ith in the registers 14 and 17. The light-emission current Isw is a current obtained by subtracting the threshold current Ith of the laser diode LD from a drive current Iop used when the laser diode LD emits light of a desired amount of light emission. The reference voltage source 12 includes a fixed voltage source that generates a constant voltage Vr; and a variable voltage divider circuit that divides the voltage Vr under the control of the control circuit 11A. The voltage Vr corresponds to a voltage signal from the photodiode PD for when the laser diode LD emits light of a desired amount of light emission Po. A variable reference voltage generated by the reference voltage source 12 is inputted to a non-inverting input terminal of the comparator 13. The voltage signal from the photodiode PD is inputted to an inverting input terminal of the comparator 13. An output signal from the comparator 13 is inputted to the control circuit 11A.

The current generator circuits 1 and 2 are current-voltage converter circuits or current output type D/A converters. The current generator circuit 1 generates a first input current (e.g., Isw/Q) for the transistors TR1 and TR2 from a set value generated by the control circuit 11A or the set value for the light-emission current Isw stored in the register 14. The current generator circuit 2 generates a second input current (e.g., Ith/Q) for the transistors TR1 and TR2 from the set value for the threshold current Ith stored in the register 17.

The switch TR3 is turned on when the light-emission control signal is at a high level (H), and is turned off when the light-emission control signal is at a low level (L). Therefore, when the light-emission control signal is at a high level, the sum of the first and second input currents is supplied to the transistors TR1 and TR2, and when the light-emission control signal is at a low level, only the second input current is supplied to the transistors TR1 and TR2.

Figure 6:
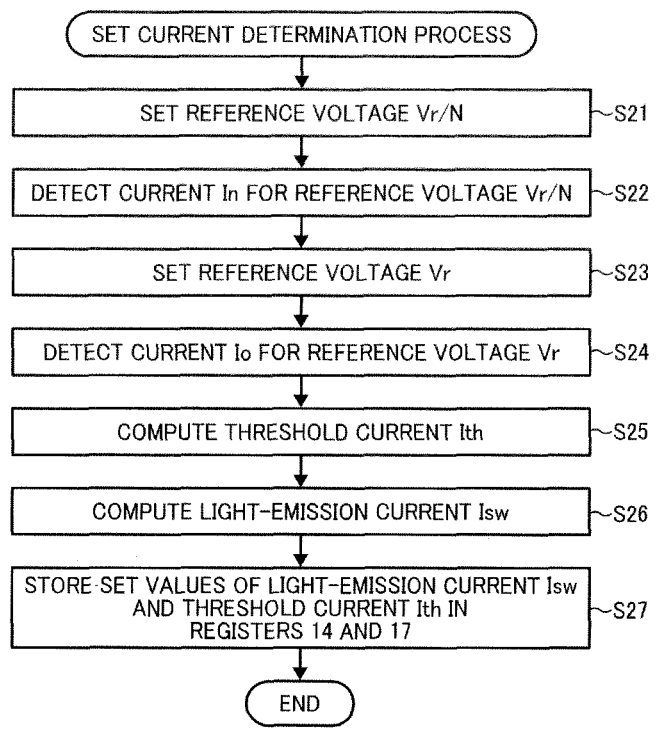
FIG. 6 is a flowchart illustrating a set current determination process performed by a control circuit 11A of FIG. 5.

FIG. 6 is a flowchart illustrating a set current determination process performed by the control circuit 11A of FIG. 5. The control circuit 11A instructs an external circuit to bring a light-emission control signal to a high level (H) to turn on the switch TR3. The control circuit 11A generates a set value for a variable input current for the transistors TR1 and TR2, and transmits the set value to the current generator circuit 1. At step S21, the control circuit 11A sets a reference voltage Vr/N using the reference voltage source 12. At step S22, the control circuit 11A performs Auto Power Control (APC) by changing the input current for the transistors TR1 and TR2. By this, the control circuit 11A detects a current In for the reference voltage Vr/N, based on a voltage signal from the photodiode PD. At step S23, the control circuit 11A sets a reference voltage Vr using the reference voltage source 12. At step S24, the control circuit 11A performs APC by changing the input current for the transistors TR1 and TR2. By this, the control circuit 11A detects a current Io for the reference voltage Vr, based on a voltage signal from the photodiode PD. The current Io is a drive current Iop used when the laser diode LD emits light of a desired amount of light emission. At step S25, the control circuit 11A computes a threshold current Ith, based on the currents In and Io. Here, when the amount of light emission P is represented as a function of the drive current Iop, the value of the drive current Iop at an intersection of a tangent line to the function at a desired amount of light emission Po and a straight line indicating an amount of light emission of zero is computed as the threshold current Ith. At step S26, the control circuit 11A computes a light-emission current Isw by subtracting the threshold current Ith from the current Io. At step S27, the control circuit 11A stores the set values of the light-emission current Isw and the threshold current Ith in the registers 14 and 17.

Figure 7:
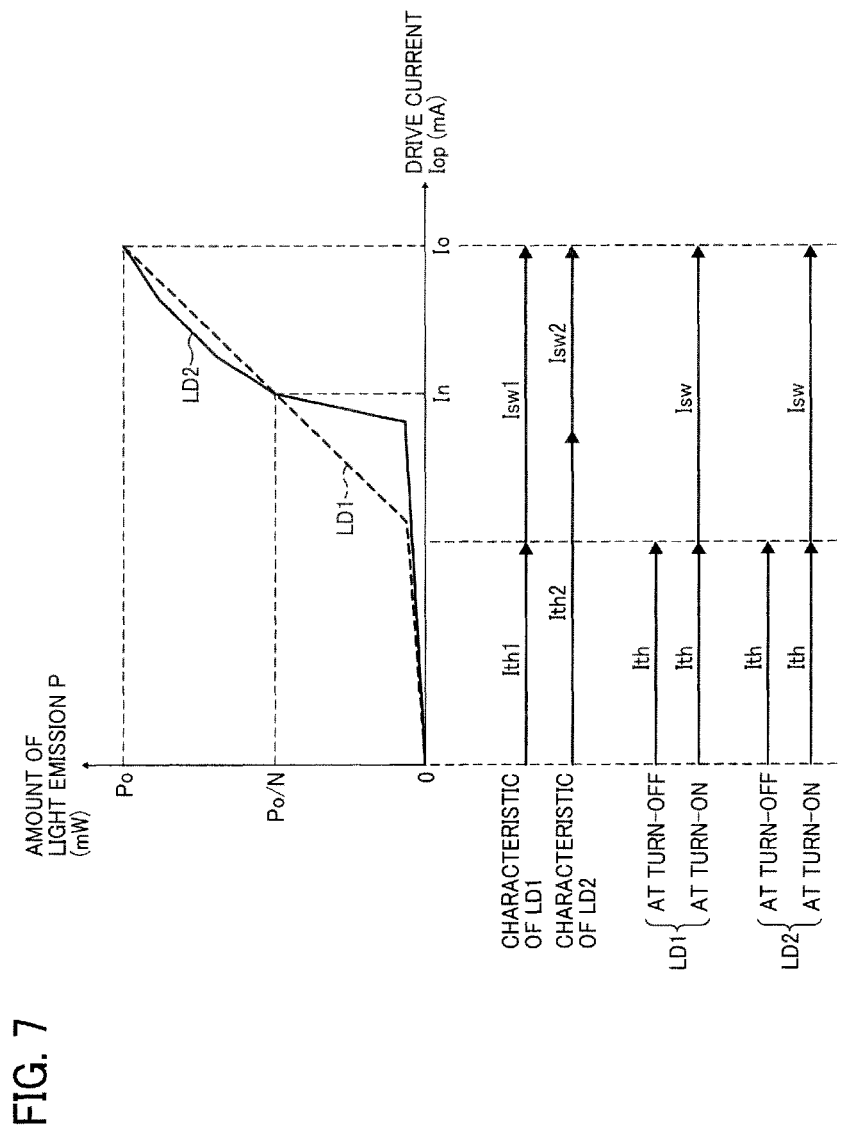
FIG. 7 is a diagram illustrating the characteristics of the amount of light emission P with respect to a drive current Iop, threshold currents, and light-emission currents, which are obtained when the semiconductor laser drive apparatus of FIG. 5 uses laser diodes LD1 and LD2.

FIG. 7 is a diagram illustrating the characteristics of the amount of light emission P with respect to the drive current Iop, threshold currents, and light-emission currents, which are obtained when the semiconductor laser drive apparatus of FIG. 5 uses laser diodes LD1 and LD2. The case of using, as the laser diode LD of FIG. 5, laser diodes LD1 and LD2 having different characteristics (threshold currents and light-emission currents) is considered. The laser diode LD1 has a threshold current Ith1 and a light-emission current Isw1, and has excellent linearity of the amount of light emission P with respect to the drive current Iop. The laser diode LD2 has a threshold current Ith2 and a light-emission current Isw2, but when the drive current Iop gets larger, the slope of the amount of light emission P with respect to the drive current Iop gets smaller, and thus, the linearity of the amount of light emission P with respect to the drive current Iop is lost. According to the conventional art, when the amount of light emission P is represented as a function of the drive current Iop, the value of the drive current Iop at an intersection of a tangent line to the function at a desired amount of light emission Po and a straight line indicating an amount of light emission of zero is computed as the threshold current Ith. By thus computing the threshold current Ith and the light-emission current Isw, the amount of light emission P that changes proportionally to the amount of change in drive current Iop is obtained near the desired amount of light emission Po. Therefore, with the laser diode LD1, an accurate threshold current Ith is computed and a shading correction function can be achieved. However, if the linearity of the amount of light emission P with respect to the drive current Iop is lost as in the case of the laser diode LD2, then although a shading correction function can be achieved, a computed threshold current Ith is lower than the actual threshold current Ith2 of the laser diode LD2.

Figure 8:
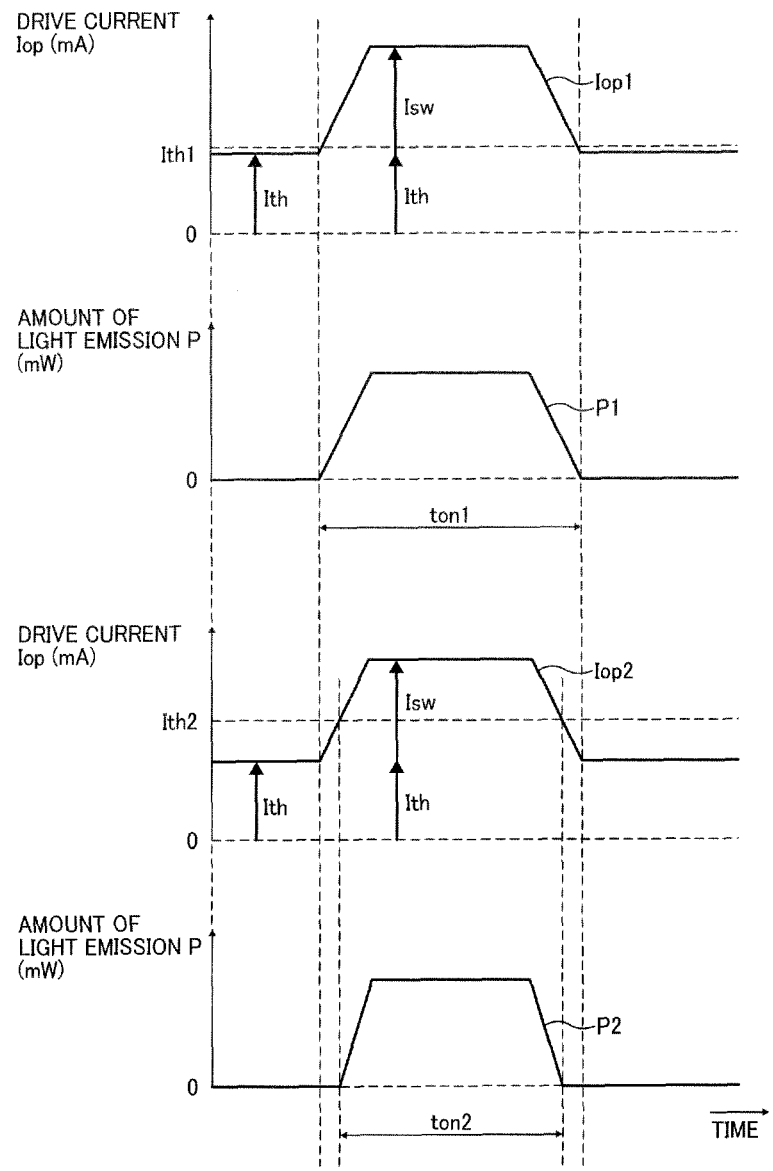
FIG. 8 is a diagram illustrating the characteristics of drive currents and the amounts of light emission, which are obtained when the semiconductor laser drive apparatus of FIG. 5 uses the laser diodes LD1 and LD2.

FIG. 8 is a diagram illustrating the characteristics of drive currents and the amounts of light emission, which are obtained when the semiconductor laser drive apparatus of FIG. 5 uses the laser diodes LD1 and LD2. The first and second graphs from the top in FIG. 8 illustrate the characteristics of the drive current Iop1 and the amount of light emission P1 of the laser diode LD1, respectively. The third and fourth graphs from the top in FIG. 8 illustrate the characteristics of the drive current Iop2 and the amount of light emission P2 of the laser diode LD2, respectively. With the laser diode LD1, an accurate threshold current Ith1 can be computed, and thus, the laser diode LD1 emits light for a period of time ton1 which is the same as the pulse width of the light-emission current Isw. On the other hand, with the laser diode LD2, a threshold current Ith which is computed to be smaller than the actual threshold current Ith2 is supplied, and thus, a period of time tong during which the laser diode LD2 emits light is shorter than the pulse width of the light-emission current Isw.

With reference to FIGS. 1 to 4, a semiconductor laser drive apparatus according to an embodiment of the present invention will be described below.

FIG. 1 is a block diagram illustrating a configuration of a semiconductor laser drive apparatus according to an embodiment of the present invention. The semiconductor laser drive apparatus of FIG. 1 includes a current setting circuit 10 instead of the current setting circuit 10A of FIG. 5, and further includes a multiplexer 3. The current setting circuit 10 includes a control circuit 11, a reference voltage source 12, a comparator 13, and registers 14 to 16.

The control circuit 11 of the current setting circuit 10 performs a set current determination process which will be described later with reference to FIG. 2, to compute a light-emission current Isw and bias currents Ithon and Ithoff of a laser diode LD, and store set values for the light-emission current Isw and the bias currents Ithon and Ithoff in the registers 14 to 16. The bias current Ithon is a bias current to be supplied to the laser diode LD when the laser diode LD emits light. The bias current Ithoff is a bias current to be supplied to the laser diode LD when the laser diode LD does not emit light. The light-emission current Isw is a current obtained by subtracting the bias current Ithon from a drive current Iop used when the laser diode LD emit light of a desired amount of light emission.

The multiplexer 3 transmits the set value of the bias current Ithon stored in the register 15 to a current generator circuit 2 when a light-emission control signal is at a high level. The multiplexer 3 transmits the set value of the bias current Ithoff stored in the register 16 to the current generator circuit 2 when the light-emission control signal is at a low level. The current generator circuit 2 generates a second input current (e.g., Ithon/Q) or a third input current (e.g., Ithoff/Q) for transistors TR1 and TR2 from the set value for the bias current Ithon or Ithoff stored in the register 15 or 16. Therefore, by a switch TR3 and the multiplexer 3 operating as a switching circuit according to the light-emission control signal, the following input currents are supplied to the transistors TR1 and TR2.

When the light-emission control signal is at a high level (H), the sum of the first and second input currents is supplied to the transistors TR1 and TR2, and when the light-emission control signal is at a low level (L), only the third input current is supplied to the transistors TR1 and TR2.

Figure 2:
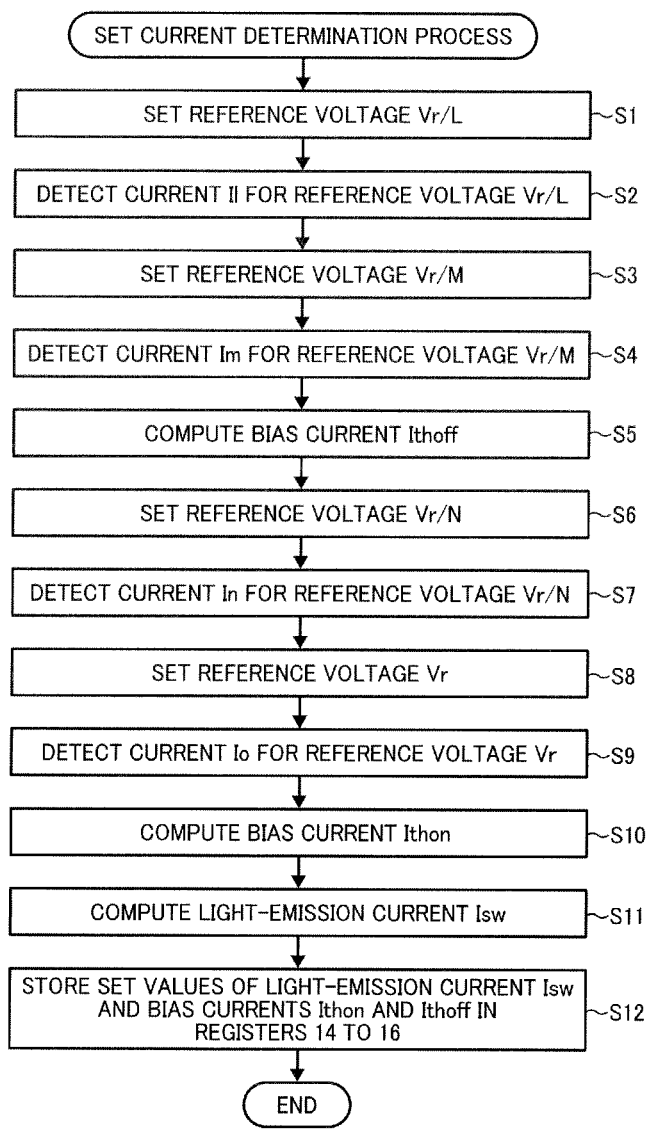
FIG. 2 is a flowchart illustrating a set current determination process performed by a control circuit 11 of FIG. 1.

FIG. 2 is a flowchart illustrating a set current determination process performed by the control circuit 11 of FIG. 1. At step S1, the control circuit 11 sets a reference voltage Vr/L using the reference voltage source 12. At step S2, the control circuit 11 performs APC by changing an input current for the transistors TR1 and TR2. By this, the control circuit 11 detects a current Il for the reference voltage Vr/L, based on a voltage signal from a photodiode PD. At step S3, the control circuit 11 sets a reference voltage Vr/M using the reference voltage source 12. At step S4, the control circuit 11 performs APC by changing the input current for the transistors TR1 and TR2. By this, the control circuit 11 detects a current Im for the reference voltage Vr/M, based on a voltage signal from the photodiode PD. At step S5, the control circuit 11 computes a bias current Ithoff, based on the currents Il and Im. Here, when the amount of light emission P is represented as a function of a drive current Iop, the value of the drive current Iop at an intersection of a tangent line to the function near an amount of light emission of zero and a straight line indicating an amount of light emission of zero is computed as the bias current Ithoff. At step S6, the control circuit 11 sets a reference voltage Vr/N using the reference voltage source 12. At step S7, the control circuit 11 performs APC by changing the input current for the transistors TR1 and TR2. By this, the control circuit 11 detects a current In for the reference voltage Vr/N, based on a voltage signal from the photodiode PD. At step S8, the control circuit 11 sets a reference voltage Vr using the reference voltage source 12. At step S9, the control circuit 11 performs APC by changing the input current for the transistors TR1 and TR2. By this, the control circuit 11 detects a current Io for the reference voltage Vr, based on a voltage signal from the photodiode PD. At step S10, the control circuit 11 computes a bias current Ithon, based on the currents In and Io. Here, when the amount of light emission P is represented as a function of the drive current Iop, the value of the drive current Iop at an intersection of a tangent line to the function at a desired amount of light emission Po and a straight line indicating an amount of light emission of zero is computed as the bias current Ithon. At step S11, the control circuit 11 computes a light-emission current Isw by subtracting a threshold current Ith from the current Io. At step S12, the control circuit 11 stores the set values of the light-emission current Isw and the bias currents Ithon and Ithoff in the registers 14 to 16.

The reference voltages at steps S1, S3, and S6 are set to satisfy L>M>N. According to the set current determination process of FIG. 2, by computing in the above-described manner the bias current Ithon used when the laser diode LD emits light, the change in the amount of light emission P is proportional to the amount of change in drive current top, enabling shading correction. For example, when the amount of change in light-emission current Isw is doubled, the amount of change in the amount of light emission P is also doubled. To compute the bias current Ithon, a tangent line to the function of the amount of light emission P with respect to the drive current Iop at the desired amount of light emission Po is used. Thus, it is preferred that "N" of the reference voltage Vr/N be as close to 1 as possible. On the other hand, the bias current Ithoff used when the laser diode LD does not emit light corresponds to the actual threshold current Ith of the laser diode LD. To determine, as the bias current Ithoff; the actual threshold current Ith as accurate as possible, a tangent line to the function of the amount of light emission P with respect to the drive current Iop near an amount of light emission of zero is used. When the bias current Ithoff is computed based on the currents In and Io, the bias current Ithoff is smaller than the actual threshold current Ith. Therefore, the bias current Ithoff is computed based on the currents Il and Im for the reference voltages Vr/L and Vr/M with the largest possible "L" and "M". When both of the bias currents Ithon and Ithoff are computed based on the currents Il and Im, the desired amount of light emission Po cannot be obtained. To obtain the desired amount of light emission Po, at least the bias current Ithon needs to be computed using a tangent line to the function of the amount of light emission P with respect to the drive current Iop at the desired amount of light emission Po.

For example, values on the order of N=2, M=5, and L=10 may be used.

Figure 3:
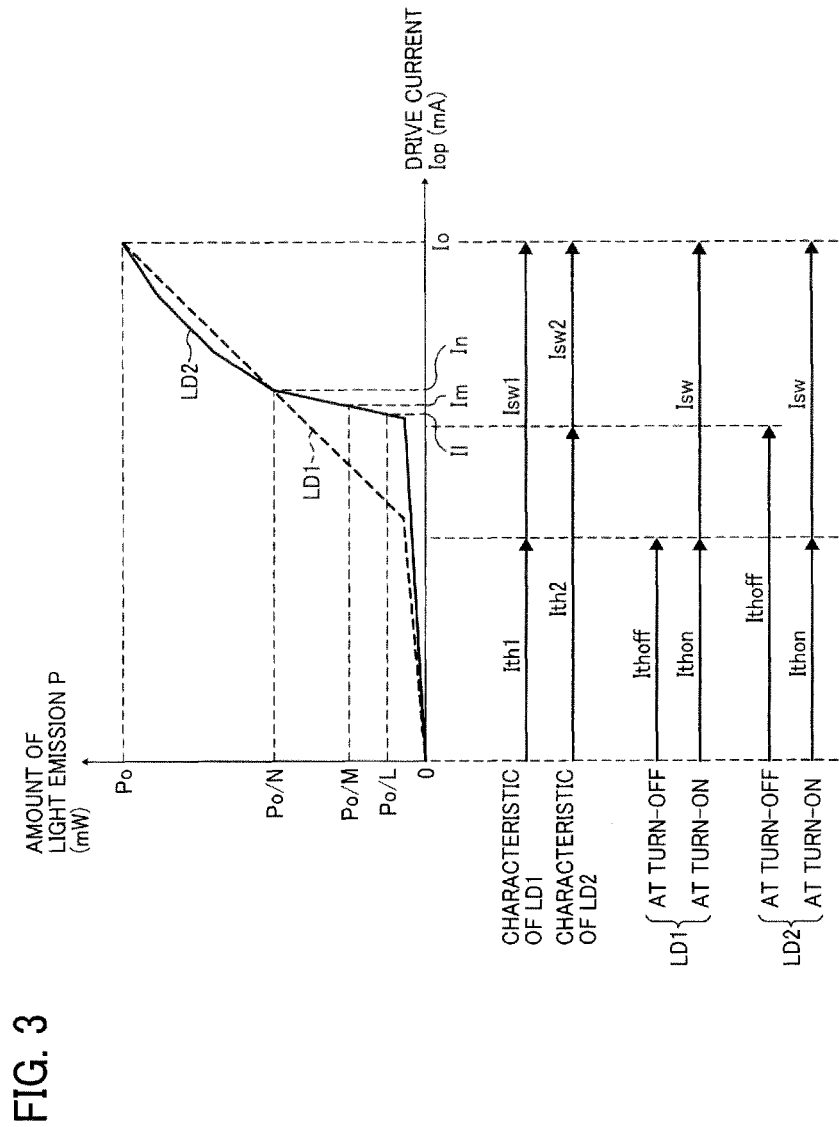
FIG. 3 is a diagram illustrating the characteristics of the amount of light emission P with respect to a drive current Iop, threshold currents, and light-emission currents, which are obtained when the semiconductor laser drive apparatus of FIG. 1 uses laser diodes LD1 and LD2.

FIG. 3 is a diagram illustrating the characteristics of the amount of light emission P with respect to the drive current Iop, threshold currents, and light-emission currents, which are obtained when the semiconductor laser drive apparatus of FIG. 1 uses laser diodes LD1 and LD2. The case of using, as the laser diode LD of FIG. 1, laser diodes LD1 and LD2 having different characteristics (threshold currents and light-emission currents) as in the case of FIG. 7 is considered. First, when, as described previously, the amount of light emission P is represented as a function of the drive current Iop, the value of the drive current Iop at an intersection of a tangent line to the function at a desired amount of light emission Po and a straight line indicating an amount of light emission of zero is computed as a bias current Ithon. By thus computing the bias current Ithon and a light-emission current Isw, the amount of light emission P that changes proportionally to the amount of change in drive current Iop is obtained near the desired amount of light emission Po. Therefore, with the laser diode LD1, a shading correction function can be achieved. In addition, when, as described previously, the amount of light emission P is represented as a function of the drive current Iop, the value of the drive current top at an intersection of a tangent line to the function near an amount of light emission of zero and a straight line indicating an amount of light emission of zero is computed as a bias current Ithoff. When the amount of light emission P changes linearly with respect to the drive current Iop as in the case of the laser diode LD1, Ith1=Ithoff=Ithon. Even if the linearity of the amount of light emission with respect to the drive current is lost as in the case of the laser diode LD2, the computed bias current Ithoff is equal to the actual threshold current Ith2.

Figure 4:
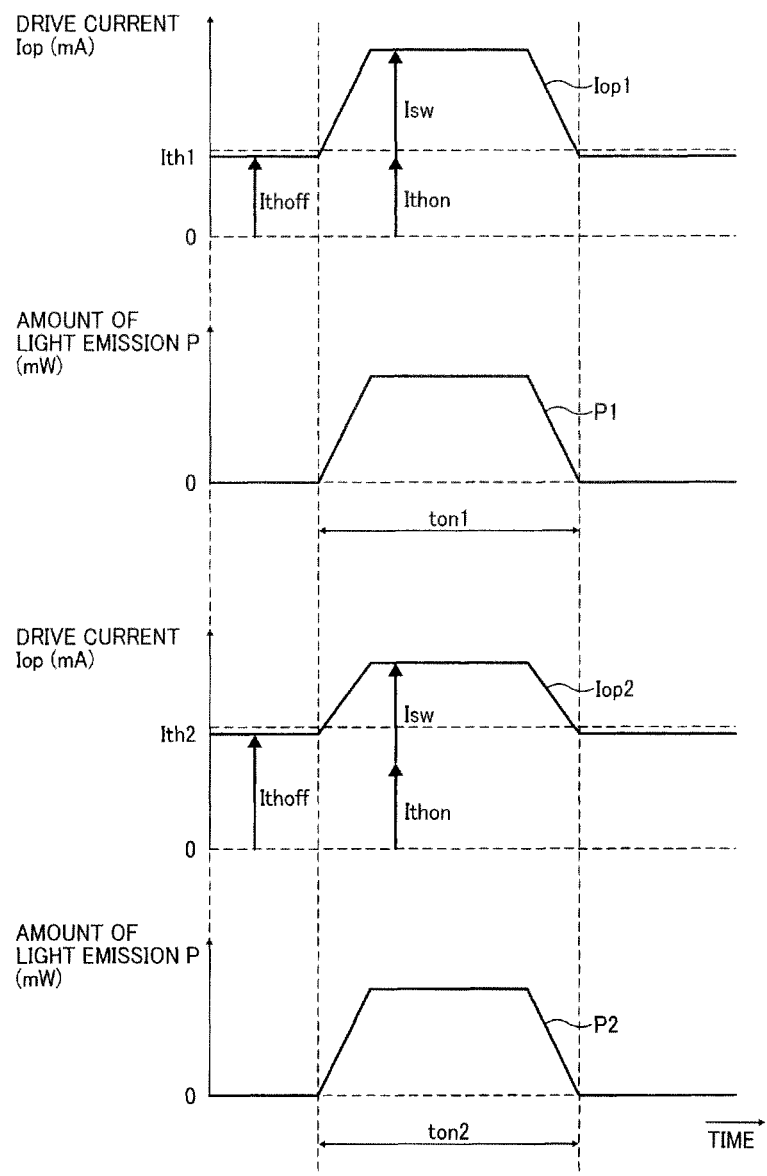
FIG. 4 is a diagram illustrating the characteristics of drive currents and the amounts of light emission, which are obtained when the semiconductor laser drive apparatus of FIG. 1 uses the laser diodes LD1 and LD2.

FIG. 4 is a diagram illustrating the characteristics of drive currents and the amounts of light emission, which are obtained when the semiconductor laser drive apparatus of FIG. 1 uses the laser diodes LD1 and LD2. The first and second graphs from the top in FIG. 4 illustrate the characteristics of the drive current Iop1 and the amount of light emission P1 of the laser diode LD1, respectively. The third and fourth graphs from the top in FIG. 4 illustrate the characteristics of the drive current Iop2 and the amount of light emission P2 of the laser diode LD2, respectively. For both of the laser diodes LD1 and LD2, accurate bias currents Ithon and Ithoff can be computed. Thus, the laser diodes LD1 and LD2 emit light for a period of time which is the same as the pulse width of the light-emission current Isw (ton1=ton2). The drive current Iop transitions between the current Ithoff and the current "Ithon+Isw", according to the light-emission control signal.

The current setting circuit 10, the multiplexer 3, the current generator circuits 1 and 2, the switch TR3, and the transistors TR1 and TR2 may be integrated into a single integrated circuit.

An image forming apparatus including a semiconductor laser element, such as a laser diode, and the above-described semiconductor Laser drive apparatus may be formed.

Although, in the examples illustrated in FIGS. 3 and 4, Ithoff>Ithon, the set current determination process of FIG. 2 can be applied even in the case of Ithoff<Ithon.

A semiconductor laser drive apparatus and an image forming apparatus according to aspects of the present invention are characterized by including the following configurations.

According to a semiconductor laser drive apparatus according to a first aspect of the present invention, the semiconductor laser drive apparatus controls a drive current to be supplied to a semiconductor laser element, according to a light-emission control signal instructing to turn on or off the semiconductor laser element, and includes: a drive circuit that generates a drive current corresponding to an input current and supplies the drive current to the semiconductor laser element; a current setting circuit that stores a first set value for a light-emission current obtained by subtracting a first bias current used when the semiconductor laser element emits light, from a drive current used when the semiconductor laser element emits light of a desired amount of light emission, a second set value for the first bias current, and a third set value for a second bias current used when the semiconductor laser element does not emit light; a first current generator circuit that generates a first input current from the first set value; a second current generator circuit that generates a second input current from the second set value and generates a third input current from the third set value; and a switching circuit that supplies a sum of the first and second input currents to the drive circuit when the light-emission control signal is on, and supplies the third input current to the drive circuit when the light-emission control signal is off.

According to a semiconductor laser drive apparatus according to a second aspect of the present invention, in the semiconductor laser drive apparatus according to the first aspect, the current setting circuit: represents an amount of light emission of the semiconductor laser element as a function of the drive current of the semiconductor laser element, and computes, as the first bias current, a value of the drive current at an intersection of a tangent line to the function at the desired amount of light emission and a straight line indicating an amount of light emission of zero; computes, as the second bias current, a value of the drive current at an intersection of a tangent line to the function near the amount of light emission of zero and the straight line indicating the amount of light emission of zero; and computes and stores the first to third set values for the light-emission current and the computed first and second bias currents.

According to a semiconductor laser drive apparatus according to a third aspect of the present invention, in the semiconductor laser drive apparatus according to the first or second aspect, the first and second current generator circuits are current-voltage converter circuits or current output type D/A converters.

According to a semiconductor laser drive apparatus according to a fourth aspect of the present invention, in the semiconductor laser drive apparatus according to any one of the first to third aspects, the drive circuit generates the drive current proportional to the input current.

According to a semiconductor laser drive apparatus according to a fifth aspect of the present invention, in the semiconductor laser drive apparatus according to any one of the first to fourth aspects, the drive circuit, the current setting circuit, the first and second current generator circuits, and the switching circuit are integrated into a single integrated circuit.

According to an image forming apparatus according to a sixth aspect of the present invention, the image forming apparatus includes: a semiconductor laser element; and a semiconductor laser drive apparatus according to any one of the first to fifth aspects.

According to one aspect of the present invention, even when using a semiconductor laser element where the linearity of the amount of light emission with respect to a drive current is lost, the semiconductor laser element can be driven with an ideal light-emission delay and light-emission pulse width by supplying an optimum threshold current to the semiconductor laser element.

According to one aspect of the present invention, a first bias current to be supplied to the semiconductor laser element when the semiconductor laser element emits light and a second bias current to be supplied to the semiconductor laser element when the semiconductor laser element does not emit light are individually computed. Since one of the two bias currents is supplied to the semiconductor laser element according to a light-emission control signal, the semiconductor laser element can be driven with an ideal light-emission delay and light-emission pulse width. According to the present invention, a shading correction function can be further achieved.

The present invention can be applied to a semiconductor laser drive apparatus that performs drive and control of a semiconductor laser element used in a laser printer, a digital copier, an optical data communication apparatus, an optical disk recording apparatus, etc. The present invention can also be applied to an image forming apparatus using such a semiconductor laser drive apparatus.

Numerous additional modifications and variations are possible in light of the above teachings. It is therefore to be understood that within the scope of the appended claims, the disclosure of the present invention may be practiced otherwise than as specifically described herein. With some embodiments of the present invention having thus been described, it will be obvious that the same may be varied in many ways. For example, elements and/or features of different illustrative embodiments may be combined with each other and/or substituted for each other.

What is claimed is:

1. A semiconductor laser drive apparatus comprising:
a semiconductor laser element supplied with a drive current, the drive current being controlled according to a light-emission control signal indicating on or off;
a drive circuit that generates a drive current corresponding to an input current and supplies the drive current to the semiconductor laser element;
a current setting circuit that stores a first set value for a light-emission current obtained by subtracting a first bias current used when the semiconductor laser element emits light, from a drive current used when the semiconductor laser element emits light of a desired amount of light emission, a second set value for the first bias current, and a third set value for a second bias current used when the semiconductor laser element does not emit light;
a first current generator circuit that generates a first input current from the first set value;
a second current generator circuit that generates a second input current from the second set value and generates a third input current from the third set value; and
a switching circuit that supplies a sum of the first and second input currents to the drive circuit when the light-emission control signal is on, and supplies the third input current to the drive circuit when the light-emission control signal is off,
wherein the current setting circuit:
represents an amount of light emission of the semiconductor laser element as a function of the drive current of the semiconductor laser element, and computes, as the first bias current, a value of the drive current at an intersection of a tangent line to the function at the desired amount of light emission and a straight line indicating an amount of light emission of zero;
computes, as the second bias current, a value of the drive current at an intersection of a tangent line to the function near the amount of light emission of zero and the straight line indicating the amount of light emission of zero; and
computes and stores the first to third set values for the light-emission current and the computed first and second bias currents.

2. A semiconductor laser drive apparatus comprising:
a semiconductor laser element supplied with a drive current, the drive current being controlled according to a light-emission control signal indicating on or off;
a drive circuit that generates a drive current corresponding to an input current and supplies the drive current to the semiconductor laser element;
a current setting circuit that stores a first set value for a light-emission current obtained by subtracting a first bias current used when the semiconductor laser element emits light, from a drive current used when the semiconductor laser element emits light of a desired amount of light emission, a second set value for the first bias current, and a third set value for a second bias current used when the semiconductor laser element does not emit light;
a first current generator circuit that generates a first input current from the first set value;
a second current generator circuit that generates a second input current from the second set value and generates a third input current from the third set value; and
a switching circuit that supplies a sum of the first and second input currents to the drive circuit when the light-emission control signal is on, and supplies the third input current to the drive circuit when the light-emission control signal is off,
wherein the first and second current generator circuits are current-voltage converter circuits or current output type D/A converters.

3. A semiconductor laser drive apparatus comprising:
a semiconductor laser element supplied with a drive current, the drive current being controlled according to a light-emission control signal indicating on or off;
a drive circuit that generates a drive current corresponding to an input current and supplies the drive current to the semiconductor laser element;
a current setting circuit that stores a first set value for a light-emission current obtained by subtracting a first bias current used when the semiconductor laser element emits light, from a drive current used when the semiconductor laser element emits light of a desired amount of light emission, a second set value for the first bias current, and a third set value for a second bias current used when the semiconductor laser element does not emit light;

a first current generator circuit that generates a first input current from the first set value;

a second current generator circuit that generates a second input current from the second set value and generates a third input current from the third set value; and a switching circuit that supplies a sum of the first and second input currents as the input current to the drive circuit when the light-emission control signal is on, and supplies the third input current as the input current to the drive circuit when the light-emission control signal is off, wherein the first and second current generator circuits are current-voltage converter circuits or current output type D/A converters.

4. The semiconductor laser drive apparatus according to claim 3, wherein the current setting circuit:

represents an amount of light emission of the semiconductor laser element as a function of the drive current of the semiconductor laser element, and computes, as the first bias current, a value of the drive current at an intersection of a tangent line to the function at the desired amount of light emission and a straight line indicating an amount of light emission of zero;

computes, as the second bias current, a value of the drive current at an intersection of a tangent line to the function near the amount of light emission of zero and the straight line indicating the amount of light emission of zero; and computes and stores the first to third set values for the light-emission current and the computed first and second bias currents.

5. The semiconductor laser drive apparatus according to claim 1, wherein the current setting circuit stores the first set value, the second set value and the third set value in respective distinct storage parts.

6. The semiconductor laser drive apparatus according to claim 1, wherein the drive circuit generates the drive current proportional to the input current.

7. The semiconductor laser drive apparatus according to claim 1, wherein the drive circuit, the current setting circuit, the first and second current generator circuits, and the switching circuit are integrated into a single integrated circuit.

8. An image forming apparatus comprising:
the semiconductor laser drive apparatus according to claim 1.

9. The semiconductor laser drive apparatus according to claim 2, wherein the drive circuit generates the drive current proportional to the input current.

10. The semiconductor laser drive apparatus according to claim 2, wherein the drive circuit, the current setting circuit, the first and second current generator circuits, and the switching circuit are integrated into a single integrated circuit.

11. An image forming apparatus comprising:
the semiconductor laser drive apparatus according to claim 2.

\* \* \* \* \*